United States Patent [19]

Kowalski

[11] Patent Number: 5,448,187
[45] Date of Patent: Sep. 5, 1995

[54] ANTIFUSE PROGRAMMING METHOD AND CIRCUIT WHICH SUPPLIES A STEADY CURRENT AFTER A PROGRAMMING VOLTAGE HAS DROPPED

[75] Inventor: Jacek Kowalski, Trets, France

[73] Assignee: Gemplus Card International, Gemenos, France

[21] Appl. No.: 152,183

[22] Filed: Nov. 15, 1993

[30] Foreign Application Priority Data

Nov. 18, 1992 [FR] France ................... 9213831

[51] Int. Cl.6 .................... H03K 19/0948
[52] U.S. Cl. .................... 326/81; 327/525; 365/225.7; 257/530
[58] Field of Search ............. 307/451, 475, 202.1; 365/225.7; 257/530; 437/922; 326/81; 327/525

[56] References Cited

U.S. PATENT DOCUMENTS

| | | | |
|---|---|---|---|
| 4,122,547 | 10/1978 | Schroeder et al. | 365/189 |
| 4,820,941 | 4/1989 | Dolby et al. | 307/475 |
| 5,065,361 | 11/1991 | Yoshizawa et al. | 307/451 |
| 5,126,282 | 6/1992 | Chiang et al. | 437/922 |
| 5,146,307 | 9/1992 | Kaya | 257/530 |
| 5,194,759 | 3/1993 | El-Ayat et al. | 365/225.7 |
| 5,301,159 | 4/1994 | Lee | 257/530 |
| 5,327,024 | 7/1994 | Cox | 307/202.1 |

FOREIGN PATENT DOCUMENTS

| | | |
|---|---|---|
| 0232565 | 8/1987 | European Pat. Off. . |
| 0432049 | 6/1991 | European Pat. Off. . |
| 0432050 | 6/1991 | European Pat. Off. . |
| 2608826 | 6/1988 | France . |
| 2672434 | 8/1992 | France .................. 257/529 |
| 9216947 | 10/1992 | France . |

OTHER PUBLICATIONS

*Fast Programmable 256K Read Only Memory With On-Chip Test Circuits*, S. Atsumi et al., IEE Transactions on Electron Devices, No. 2, p. 505, Feb. 1985.

*Primary Examiner*—Edward P. Westin
*Assistant Examiner*—Benjamin D. Driscoll
*Attorney, Agent, or Firm*—Nilles & Nilles

[57] ABSTRACT

An integrated circuit, supplied with a supply voltage Vcc, the intergrated circuit including: an antifuse including terminals; and a programming circuit for programming the antifuse, the programming circuit using a programming voltage Vpp that is substantially higher than the supply voltage Vcc, wherein the programming circuit including structure to apply the supply voltage Vcc to the terminals of the antifuse immediately after an application of the programming voltage Vpp to the terminals of the antifuse so that programming of the antifuse is not interrupted.

20 Claims, 2 Drawing Sheets

ANTIFUSE PROGRAMMING METHOD AND CIRCUIT WHICH SUPPLIES A STEADY CURRENT AFTER A PROGRAMMING VOLTAGE HAS DROPPED

BACKGROUND OF THE INVENTION

1. Field of the Invention

The invention relates to integrated circuits and more specially to integrated circuits in which there is provision for antifuses which can be used to create connections after the manufacture of the integrated circuit.

By way of an example, to understand what these antifuses are, it may be recalled that it is now common practice, in integrated circuits designed for chip cards, to set apart non-volatile memory zones to which the user should be denied access. These memories are therefore filled with information elements, after which an antifuse is blown to insulate the prohibited memory zone so that its contents can no longer be transmitted to the external terminals of the card or so that the memory can no longer be written in from these terminals. Another application of the antifuses is the making of read-only memories, or of programmable logic networks.

The antifuses that are concerned here are antifuses that can be programmed electrically. They have the advantage of enabling the modification of the integrated circuit after the complete encapsulation of the circuit, and even after insertion into a chip card. A programming circuit is therefore associated with the antifuse to enable the antifuse to be programmed with a command sent from outside the integrated circuit.

The term "fuse" includes elements that are conductive in the intact state and go into an open circuit condition in the blown state or, conversely, antifuses that are insulating in the intact state and become conductive in the programmed state. The latter antifuses are more particularly but not exclusively concerned by the present invention.

2. Description of the Prior Art

In the patent application No. EP-A-0 408 419, there is a description, for example, of an antifuse that is open in the intact state, made out of a polycrystalline silicon conductor placed on top of a conductor made out of doped monocrystalline silicon, the two conductors being separated by an insulating layer that is locally very thin (about 100 angstroms thick). The very thin insulating layer is sufficient to ensure insulation between the conductors at the voltages that are normally applied to the integrated circuit. However, it can be programmed by the application of a voltage of about twenty volts. This voltage generates an electrical field, through the oxide, of several millions or tens of millions of volts per centimeter, which is greater than the breakdown threshold of the insulating material. A low value resistance is then set up between the conductors. The antifuses goes into its final state which is the programmed state. A transistor-based circuit enables the detection of the current leakages through the low-resistance connection and then makes it possible to prohibit certain functions of the integrated circuit (for example writing or reading in certain memory zones). In one application to an electrically programmable network, the programming of the antifuses sets up the connections needed to obtain the desired logic functions.

A major problem of the antifuses is related to the reliability of the antifuse in the programmed state: firstly, it is necessary to create programming conditions that will definitely (and not just probably) result in programming. Secondly, there must be certainty that a programmed fuse cannot return, under certain conditions, to its intact state (with almost infinite connection resistance) or to an uncertain state (excessively high connection resistance).

A programming voltage Vpp of about twenty volts may be applied from outside the integrated circuit, when the antifuse has to be blown. However, in order to reduce the number of connection terminals and in order to simplify the system for the user, it is preferred to design the system so that the programming voltage Vpp is generated in the very interior of the integrated circuit, using the lower voltage Vcc (generally 5 volts, but less in the future) which is used for the normal working of the circuit. This programming voltage is furthermore necessary in the non-volatile memory circuit (EEPROM), and it is therefore reasonable to seek to use the same voltage to program the fuses electrically.

Experience has shown, however, that the reliability of the programming of the fuses is not always very high, especially when the programming voltage is produced from within an integrated circuit supplied with a voltage Vcc that is smaller than the necessary programming voltage.

One of the reasons that have been found for this defect seems to be the fact that the voltage Vpp produced internally, generally with what is called a voltage multiplier or "charge pump", is not accompanied by sufficient power. In other words, the charge pump produces sufficient voltage but generally does not produce sufficient current, or in any case does not produce it in a sufficiently lasting manner.

It would seem indeed that the insufficiency of current during the programming (programming due first of all to the voltage Vpp) leads to an excessively resistive link through the thin oxide between the two conductors.

It is thought necessary obtain sufficient current (of some milliamperes) for some tens of milliseconds after the voltage-caused programming to stabilize the resistance of the connection that is set up at a sufficiently low value.

SUMMARY OF THE INVENTION

The invention proposes a method and a circuit diagram that can be used to improve the reliability of the programming of the antifuses.

According to the invention, there is proposed an integrated circuit, supplied with a supply voltage Vcc, said circuit comprising an antifuse and a programming circuit for the programming of this antifuse, the programming circuit using a programming voltage Vpp that is substantially higher than the supply voltage, wherein the programming circuit comprises means to apply the supply voltage Vcc to the terminals of the antifuse immediately after the application of the programming voltage Vpp.

Thus, notably in thin insulator breakdown antifuses, when the thin insulator has just broken down under the effect of the electrical field generated by the programming voltage, another voltage source is immediately applied to the antifuse, this voltage source having a far lower potential but being capable of giving a lasting current (in the range of some tens of milliseconds) with an intensity that is sufficient during this period of time (greater than the intensity that can be given in a lasting manner by the programming voltage source).

The programming of the antifuse is therefore not interrupted prematurely, even if the programming voltage source is incapable of giving sufficient current through the antifuse. The normal supply voltage takes over and gives current, while the antifuse is still "hot". It is at this time that its resistance is at the lowest level and makes it possible effectively to let through a substantial current (in the range of some milliamperes).

In one embodiment, the antifuse is connected to the programming voltage source Vpp by a first transistor and to the supply source by a second transistor. These two transistors are controlled, directly or indirectly, by a single programming command signal. The signal is connected, on the other side, to the ground. Since the programming command signal is, in principle, a logic signal between 0 and Vcc, it is preferably provided that the command signal will be applied to the gate of the first transistor by means of an insulation transistor which has its gate at the normal supply voltage Vcc. A bias transistor mounted as a resistor is then preferably provided between Vpp and the gate of the first transistor.

In another embodiment, there is furthermore a first transistor connected between the source of programming voltage Vpp and the antifuse, a second transistor connected between the supply Vcc and the programming voltage source and a third transistor also connected between the supply and the programming voltage source. Here too, the antifuse may be connected by its second end to a transistor.

The second transistor is then preferably controlled by the programming command signal, by means of an insulation transistor whose gate is controlled by the programming voltage; the third transistor is controlled directly by the programming command signal.

The invention can be applied notably but not exclusively to fuses with thin-insulator blowing.

MORE DETAILED DESCRIPTION

Figure 1:
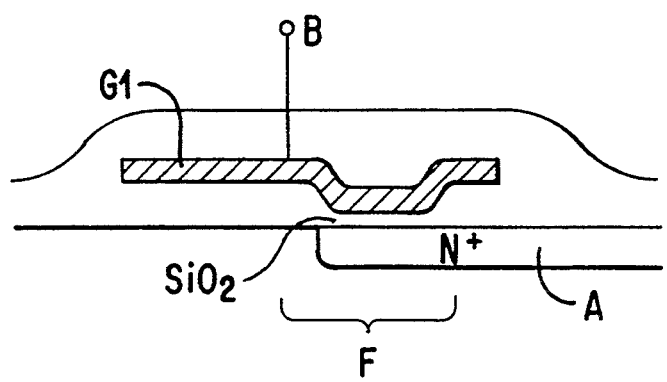
FIG. 1 shows an exemplary oxide breakdown antifuse to which the invention is especially applicable.

FIG. 1 provides an exemplary illustration of an oxide breakdown antifuse of the type described in greater detail in the patent No. EP-A-0 408 419 referred to above, where the antifuse is Made according to the same technology as an EEPROM memory using floating-gate transistors. In FIG. 1, the antifuse comprises one polycrystalline silicon gate G1, which forms a first conductor B; a second conductor A is formed by an N+ diffusion in a monocrystalline silicon substrate. The gate G1, extends above the substrate, partially above the N+ diffusion and is insulated therefrom by a thin layer of silicon oxide (SiO2). The silicon oxide is highly thinned locally in a zone between the lower gate and the N+ diffusion.

It is this thinned zone that constitutes the antifuse F. In the intact state, the oxide insulates the two conductors for voltages lower than or equal to the normal supply voltage Vcc of the integrated circuit. In the programmed state, the silicon oxide gets deteriorated and becomes resistive, thus connecting the two conductors A and B. This antifuse is, in principle, associated with a circuit for the reading of the state of the antifuse (not shown) which makes it possible to determine whether or not there is a passage of current between the conductors A and B.

The programming is done by the application of a voltage Vpp equal to about twenty volts to the N+ diffusion, the gate being grounded, or by the reverse operation (i.e. by the application of a voltage Vpp of about twenty volts to the gate, the N+ diffusion being grounded).

Figure 2:
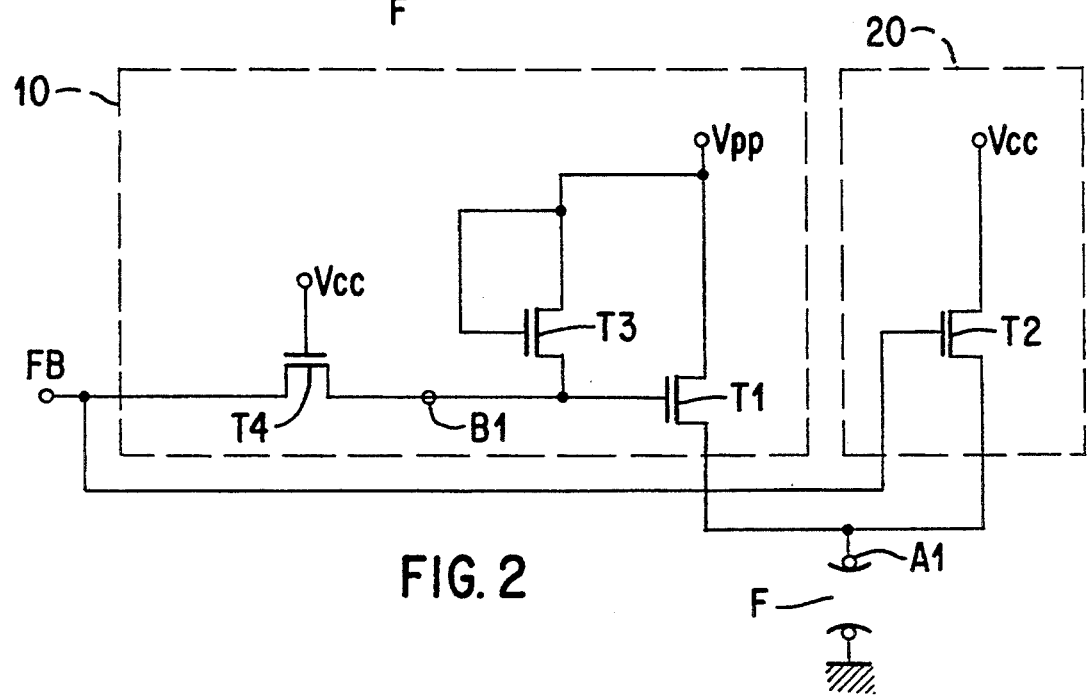
FIG. 2 shows a programming circuit according to the invention.

FIG. 2 shows the general principle of the invention, with reference to a first practical embodiment.

The programming command circuit has two parts. The first part (10) consists of a means to apply the programming voltage Vpp to the fuse. The second part (20) consists of a means for the application, to the fuse immediately after the programming, of the supply voltage Vcc, through a transistor whose dimension is chosen as a function of the current that is to be made to pass into the antifuse (a current greater than the current that the programming voltage source is capable of giving in a lasting way).

The antifuse F is connected between a node A1 and the ground. The node A1 is connected to the source of a first transistor T1 whose drain is connected to the source of the programming voltage Vpp. This source is preferably a source internal to the integrated circuit, for example a charge pump or a voltage multiplier (not shown).

The node A1 is furthermore connected to the source of a second transistor T2 whose drain is connected to the normal supply voltage Vcc of the integrated circuit. The gate of this second transistor is controlled by a programming command signal FB coming in principle either from an external terminal of the integrated circuit or from an internal logic circuit.

To make the first transistor T1 sufficiently conductive when the signal FB is active, there is provision for a third resistive means T3 mounted as a resistor (with the drain connected to its gate) and connected between Vpp and the gate of T1; there is provision also for a fourth transistor T4, interposed between the input for the reception of the signal FB and the gate of the first transistor T1; the gate of T4 is taken to Vcc. This transistor insulates the gate of T1 and keeps it at a high potential throughout the programming operation.

The transistor T1 and the transistors T3 and T4 form part of the first means 10 which applies the programming voltage Vpp to the antifuse; the transistor T2 is the second means 20, which then connects the supply source Vcc to the antifuse.

The circuit works as follows (with reference to FIG. 3 which shows the timing diagrams of signals in the circuit). The programming command signal FB is normally at zero and goes to Vcc (it is assumed that Vcc=5 volts) during a temporal square-wave signal lasting some tens of milliseconds, this square-wave signal representing the command for the programming of the fuse F.

The application of the voltage Vpp is synchronized with the signal FB, i.e. Vpp appears at the drain of the transistors T1 and T3 only substantially at the time of the rising edge of the blowing command FB.

Initially, the transistor T4 is conductive (with the source at the ground since FB is at zero; gate at Vcc); the gate of T1 is therefore also at the ground. T1 is off.

The programming command FB makes the source potential of the fourth transistor T4 rise to Vcc, turning this transistor off since its gate is also at Vcc. The gate of T1 (note B1) goes to Vpp by means of the transistor T3; Vpp rises in the meantime to its nominal value of about twenty volts. The transistor T1, made conductive, applies substantial overvoltage to the node A1. This overvoltage is sufficient to breakdown the insulator of the antifuse swiftly. A current flows in the antifuse, the intensity of which depends firstly on the size of the transistor T3 and, secondly, on the reserve of power available in the source of programming voltage Vpp; if this reserve is not sufficient to maintain a current of some milliamperes for some tens of milliseconds, then there is a risk that the resistance of the connection made by the antifuse may be excessively high (because of an insufficiently conductive connection). This is what happens in practice when the voltage Vpp is given by a charge pump internal to the integrated circuit, if it is not desired that this charge pump should be excessively bulky.

In this case, as soon as the antifuse has blown, the potential Vpp falls very swiftly to a far smaller value. It is then that the transistor T2 comes into play. The gate of T2 is taken to the potential of FB and its source is taken to that of the node A1, its drain being at Vcc. So long as the potential of the node A1 remains close to the nominal value of Vpp (between the start of the square-wave signal corresponding to Vpp and the blowing instant), T2 remains off. However, as soon as the antifuse programs, the potential of the node A1 falls to a far lower value (for example two volts) so that the transistor T2 becomes conductive and gives an additional current in the antifuse, doing so until the interruption of the square-wave signal FB and independently of the power reserve available in the source Vpp.

It will be noted that while the transistor T2 conducts current, the conductor T1 remains conductive for its gate (node B1) remains at a high voltage by capacitive effect, the transistor T3 going off when Vpp falls towards Vcc or below and the transistor T4 being off from the start of the square-wave signal.

The dimensions of the transistor T2 are chosen as a function of the current desired for the blowing of the antifuse. It is observed, in particular, that it is preferable to provide a current greater than the one that will flow in normal use in the antifuse. Indeed, it would seem that if an antifuse is blown with a current I, leading to a certain final resistance R of the programmed connection (the resistance R diminishes with the current I), then the subsequent passage of a current greater than I risks causing variation in the value of the connection resistance, which is harmful. In certain cases, the passage of a current that is excessively greater than the programming current I may even lead to the destruction of the connection with the antifuse returning to an insulator state, which is quite unacceptable.

This especially raises the problem of the reprogramming of an already programmed fuse. It is sometimes necessary to repeat a programming command even if the fuse is already programmed.

Figure 4:
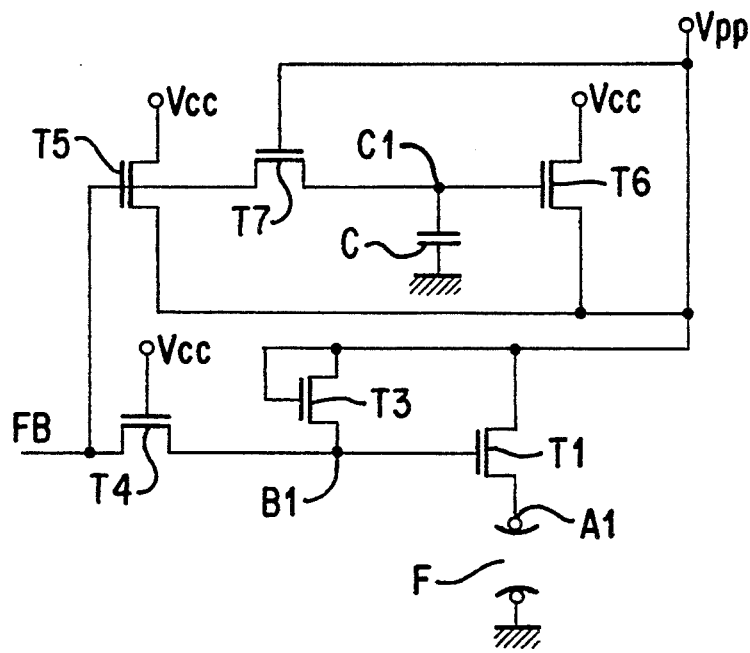
FIG. 4 shows another embodiment of the a programming circuit according to the invention.

The diagram of FIG. 4 seems to present advantages that enable both the blowing of the intact antifuse and the reprogramming of an already programmed antifuse, with a current that is lower in the latter case than in the former case. This diagram should therefore prevent a deterioration of the connection during the second programming.

In FIG. 4, the elements that correspond to those of FIG. 2 are designated by the same numerical references: the transistors T1, T3, T4, the antifuse F, the programming signal FB, the supplies Vcc and Vpp. All these figures are connected as in FIG. 2 and fulfil the same functions.

For the application of the supply voltage Vcc for several tens of milliseconds, immediately after the programming of the fuse by Vpp, there is provision for:
  a small-sized transistor T5 having its gate controlled by the signal FB, its drain at Vcc and its source connected to the drain of T1, hence to the source of programming voltage Vpp;
  a large-sized transistor T6 (which will give the main current after the programming of the fuse by Vpp); its drain is connected to the supply source at Vcc, its source to Vpp; its gate is controlled by the signal FB, but through an insulation transistor T7 whose gate is controlled by the voltage Vpp;
  a capacitor C between the gate of T6 (node C1) and the ground.

Figure 3:
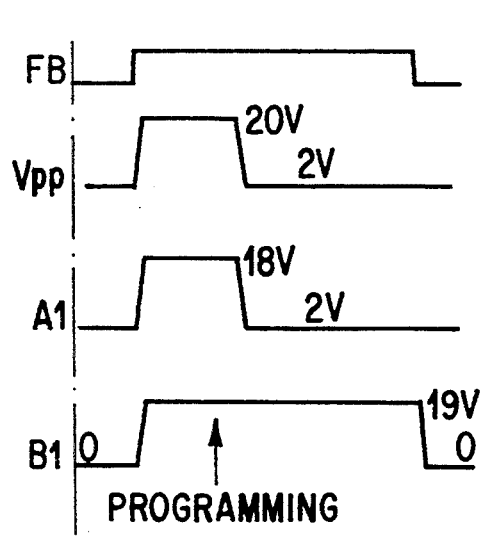
FIG. 3 shows the timing diagrams of the potentials applied to the circuit of FIG. 2.
Figure 5:
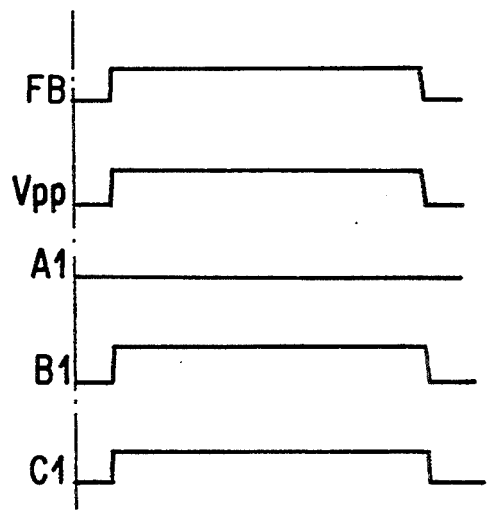
FIG. 5 shows the timing diagrams of potentials in the case of the reprogramming of an already programmed fuse.

During the programming of the antifuse, the potentials vary according to substantially the same diagram as in FIG. 3; during the reprogramming, the potentials vary rather as indicated in FIG. 5. The difference between the diagrams results from the fact that, when the antifuse is already blown, the voltage Vpp in practice cannot rise beyond 5 volts. There is therefore no phase where the nodes A1 or B1 can rise to about 20 volts. The result thereof is a weaker current in the antifuse. For example, at no time does the transistor T1 have its gate carried to a potential of over 5 volts whereas, at the time of the first programming, the gate potential of T1 is far higher and therefore lets through a substantial level of current.

In an alternative embodiment of the diagrams pertaining to the invention, a current limiting transistor is interposed between the end of the antifuse and the ground, and in activating the conduction of this transistor by a signal (BOOST) that starts only when the programming voltage Vpp has reached or practically reached its nominal value.

According to another variant, which can be used at the same time as the foregoing variant since it uses an analog signal (BOOST), a bootstrap capacitor is connected to the node A1, i.e. to the source of the transistor T1 (or possibly to the conductor that conveys the programming voltage, i.e. to the drain of the transistor t1). This capacitor gets charged while the programming voltage rises to its nominal value. The BOOST signal is a voltage square-wave signal that goes from 0 to Vcc only when Vpp has reached or practically reached its nominal value.

Figure 6:
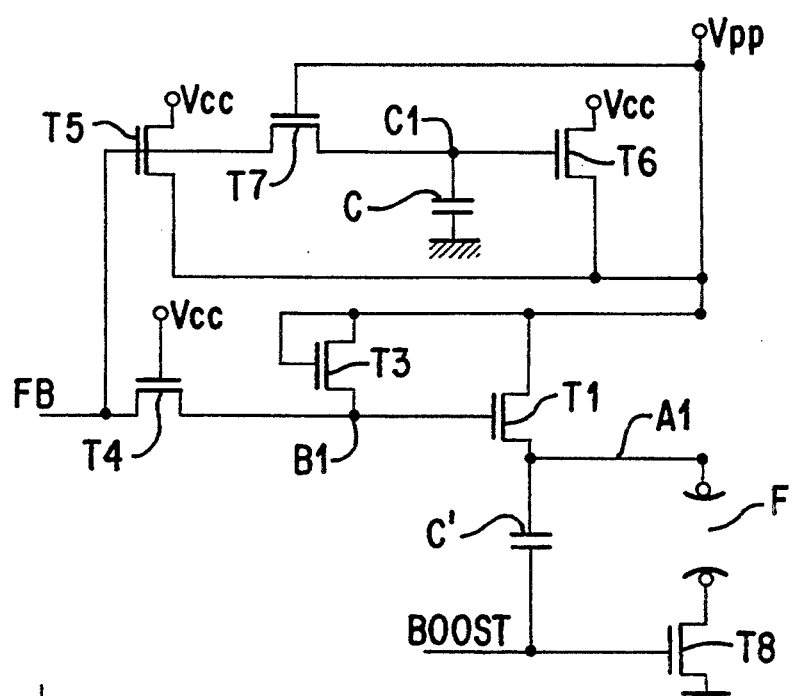
FIG. 6 shows a modification of the diagram of FIG. 4.

FIG. 6 shows the circuit diagram that results from these two modifications, made simultaneously to the diagram of FIG. 4. The additional transistor interposed between the antifuse and the ground is T8. Its gate is controlled by the BOOST signal. The bootstrap capacitor is C'; it is connected to the node A1 in the case of FIG. 6. Its other end receives the signal BOOST and can therefore be connected to the gate of T8.

Figure 7:
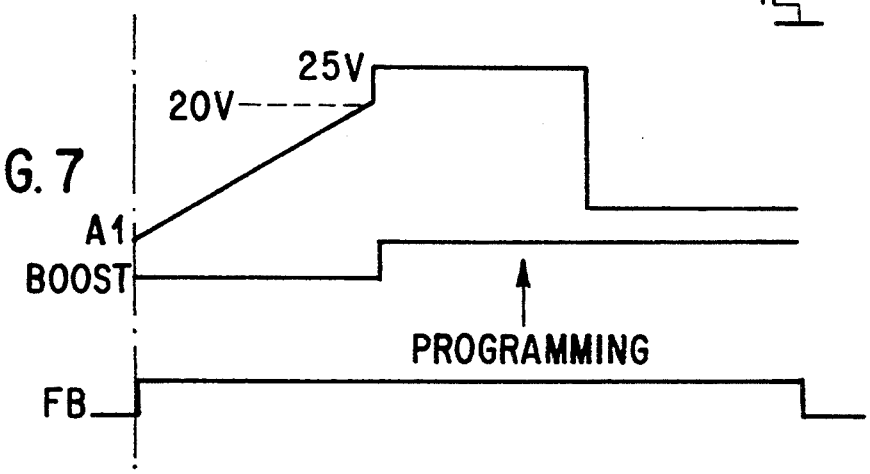
FIG. 7 shows a timing diagram corresponding to FIG. 6.

FIG. 7 shows the timing diagrams resulting from the presence of the BOOST signal. The rise in voltage Vpp is relatively slow. Consequently, the node A1 also goes slowly from 0 to its rated value (20 volts for example) starting from the moment when the programming command is triggered. In the meantime, the capacitor C' gets charged. When Vpp has substantially reached its rated value, the BOOST signal is applied and makes the potential of the node A1, namely of the first end of the fuse, rise instantaneously. Simultaneously, the transistor T8 becomes conductive and takes the other end of the antifuse to the ground. The programming potential applied to the fuse is therefore greater than what it is in the case of FIGS. 2 and 4, which improves the final quality of the programmed antifuse. The transistor T8 limits the current flowing through the antifuse. This is useful to control the discharge time of the node A1 during the programming. Indeed, if this node gets discharged too quickly, the transistors T1 and T6 do not have sufficient time to get conductive and there is a risk that the antifuse may get cold before the arrival of the stabilization current coming from the voltage source at Vcc.

What is claimed is:

1. An integrated circuit, supplied with a supply voltage Vcc, said integrated circuit comprising:
   an antifuse including terminals; and
   a programming circuit for programming the antifuse, the programming circuit using a programming voltage Vpp that is substantially higher than the supply voltage Vcc,
   wherein the programming circuit comprises means to apply the supply voltage Vcc to the terminals of the antifuse immediately after an application of the programming voltage Vpp to the terminals of the antifuse so that programming of the antifuse is not interrupted.

2. An integrated circuit according to claim 1, further comprising a source of programming voltage Vpp that is a source internal to the integrated circuit, said source of programming voltage Vpp producing the programming voltage Vpp from the supply voltage Vcc.

3. An integrated circuit according to claim 1, further comprising a first transistor connected between a source of programming voltage Vpp and the antifuse, and a second transistor connected between a source of supply voltage Vcc and the antifuse.

4. An integrated circuit according to claim 3, further comprising an insulation transistor, wherein a gate of the first transistor is controlled, through the insulation transistor, by a programming command signal FB, and a gate of the second transistor is controlled by the programming command signal FB.

5. An integrated circuit according to claim 4, wherein the insulation transistor includes a gate that is controlled by the supply voltage Vcc and the means to apply the supply voltage Vcc to the terminals of the antifuse applies the supply voltage Vcc to the terminals of the antifuse when a resistance of the antifuse is at a lowest level.

6. An integrated circuit according to claim 4, wherein a drain of the first transistor is connected to a gate of the first transistor through a bias transistor mounted as a resistive means.

7. An integrated circuit according to claim 1, further comprising a first transistor connected between a source of programming voltage Vpp and the antifuse, a second transistor connected between a source of supply voltage Vcc and the source of programming voltage Vpp and a third transistor also connected between the source of supply voltage Vcc and the source of programming voltage Vpp, wherein the second transistor is controlled by a programming command signal FB through an insulation transistor having a gate that is controlled by the programming voltage Vpp, and the third transistor is controlled directly by the programming command signal FB.

8. An integrated circuit according to claim 1, wherein the antifuse includes two conductors separated by an insulator that is capable of breaking down under the effect of an electrical field generated in the insulator by the application of the programming voltage Vpp between the two conductors just before the supply voltage Vcc is applied to the terminals of the antifuse.

9. An integrated circuit according to claim 7, further comprising a current limiting transistor interposed between one end of the antifuse and a ground.

10. An integrated circuit according to claim 9, further comprising a bootstrap structure having i) a first end connected to the antifuse and being capable of being charged by the programming voltage Vpp during the application of the programming voltage Vpp to the antifuse and ii) a second end receiving a signal BOOST that includes a voltage square-wave signal that starts when the programming voltage Vpp has reached substantially a nominal value.

11. A method of programming an antifuse in an integrated circuit comprising:
   connecting the antifuse to a source of a programming voltage Vpp, that is higher in voltage than a normal supply voltage Vcc for the integrated circuit, so as to apply said programming voltage Vpp to said antifuse; and
   connecting the antifuse to a voltage supply source immediately after applying said programming voltage Vpp to said antifuse so that programming of the antifuse is not interrupted, said voltage supply source having a lower potential than said source of said programming voltage Vpp, aid voltage supply source being capable of providing to said antifuse a lasting current with an intensity greater than that which can be provided in a lasting way by said source of said programming voltage Vpp.

12. A method according to claim 11, wherein the voltage supply source provides a current of at least two milliamperes for at least twenty milliseconds to the antifuse when a resistance of the antifuse is at a lowest level.

13. A method according to claim 11, wherein said antifuse includes a layer of insulator between two conductors and programming said antifuse includes converting said layer of insulator into a resistive layer just before the antifuse is connected to the voltage supply source.

14. A method according to claim 12, wherein said antifuse includes a layer of insulator between two conductors and programming said antifuse includes converting said layer of insulator into a resistive layer just before the antifuse is connected to the voltage supply source.

15. An integrated circuit, supplied with a supply voltage Vcc, the integrated circuit comprising:
   an antifuse including terminals; and
   a programming circuit that uses a programming voltage Vpp that is substantially higher than the supply voltage Vcc, said programming circuit including a first transistor, a first end of said first transistor being connected to a source of programming voltage Vpp, a second end of said first transistor being connected to the antifuse, and a gate of said first transistor being controlled by a programming command signal FB;

a second transistor, a first end of said second transistor being connected to a source of supply voltage Vcc, a second end of said second transistor being connected to the source of programming voltage Vpp, and a gate of said second transistor being controlled by the programming command signal FB;

a third transistor, a first end of said third transistor being connected to the source of supply voltage Vcc, a second end of said third transistor being connected to the source of programming voltage Vpp, and a gate of said third transistor being controlled by the programming command signal FB; and an insulation transistor, a first end of said insulation transistor being connected to a source of programming command signal FB, and a second end of said insulation transistor being connected to the gate of the first transistor, wherein the supply voltage Vcc can be applied to the terminals of the antifuse immediately after an application of the programming voltage Vpp to the terminals of the antifuse so that the programming of the antifuse is not interrupted.

16. An integrated circuit according to claim 15, wherein the insulation transistor includes a gate that is controlled by the supply voltage Vcc and the supply voltage Vcc is applied to the terminals of the antifuse when a resistance of the antifuse is at a lowest level.

17. An integrated circuit according to claim 15, wherein said first end of said first transistor is a drain, said second end of said first transistor is a source and said drain of said first transistor is connected to said gate of said first transistor through a bias transistor mounted as a diode.

18. An integrated circuit according to claim 10, further comprising an insulation transistor, wherein the gate of the first transistor is controlled, through the insulation transistor, by the programming command signal FB.

19. An integrated circuit according to claim 18, wherein the insulation transistor includes a gate that is controlled by the supply voltage Vcc and the means to apply supply voltage Vcc to the terminals of the antifuse applies the supply voltage Vcc to the terminals of the antifuse when a resistance of the antifuse is at a lowest level.

20. An integrated circuit according to claim 18, wherein the drain of the first transistor is connected to the gate of the first transistor through a bias transistor mounted as a resistive means.

* * * * *